US009995777B2

(12) United States Patent
Von Novak, III et al.

(10) Patent No.: US 9,995,777 B2
(45) Date of Patent: Jun. 12, 2018

(54) DEVICE DETECTION THROUGH DYNAMIC IMPEDANCE CHANGE MEASUREMENT

(71) Applicant: QUALCOMM Incorporated, San Diego, CA (US)

(72) Inventors: William Henry Von Novak, III, San Diego, CA (US); Cody Burton Wheeland, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 306 days.

(21) Appl. No.: 14/486,690

(22) Filed: Sep. 15, 2014

(65) Prior Publication Data

US 2015/0233987 A1    Aug. 20, 2015

Related U.S. Application Data

(60) Provisional application No. 61/940,254, filed on Feb. 14, 2014.

(51) Int. Cl.
| | |
|---|---|
| G01R 27/08 | (2006.01) |
| H02J 7/02 | (2016.01) |
| H02J 5/00 | (2016.01) |
| G01R 31/40 | (2014.01) |
| H02J 50/90 | (2016.01) |
| H02J 50/40 | (2016.01) |
| H02J 50/12 | (2016.01) |

(52) U.S. Cl.
CPC ............ *G01R 27/08* (2013.01); *G01R 31/40* (2013.01); *H02J 5/005* (2013.01); *H02J 7/025* (2013.01); *H02J 50/12* (2016.02); *H02J 50/40* (2016.02); *H02J 50/90* (2016.02)

(58) Field of Classification Search
None
See application file for complete search history.

(56) References Cited

U.S. PATENT DOCUMENTS

2009/0009006 A1*   1/2009   Jin .................... H02J 7/0011
                                                 307/104
2010/0277003 A1*  11/2010   Von Novak ......... H02J 17/00
                                                 307/104

(Continued)

FOREIGN PATENT DOCUMENTS

WO    WO-2013038808 A1    3/2013

OTHER PUBLICATIONS

International Search Report and Written Opinion—PCT/US2015/014853—ISA/EPO—Jun. 15, 2015.

*Primary Examiner* — Vincent Q Nguyen
(74) *Attorney, Agent, or Firm* — Knobbe, Martens, Olson & Bear LLP

(57) ABSTRACT

Inventive aspects include systems, methods, and apparatuses for detecting placement of a wireless power receiver in a charging region of a wireless power transmitter. For example, the apparatus may include a transmit circuit comprising a transmit coil and be configured to wirelessly transmit power via a wireless filed applied to the charging region to a receive coil of the receiver. The apparatus may also include a detection circuit configured to detect a characteristic waveform resulting from the field that is applied to the charging region or changed between the transmit and receive coils, in response to the receiver being placed in the charging region.

34 Claims, 11 Drawing Sheets

(56) References Cited

U.S. PATENT DOCUMENTS

| | | | |
|---|---|---|---|
| 2013/0106197 A1* | 5/2013 | Bae | H04B 5/0037 |
| | | | 307/104 |
| 2013/0154554 A1 | 6/2013 | Sakai et al. | |
| 2013/0154557 A1* | 6/2013 | Lee | H04B 5/0037 |
| | | | 320/108 |
| 2014/0062395 A1* | 3/2014 | Kwon | H02J 50/60 |
| | | | 320/108 |
| 2014/0111018 A1* | 4/2014 | Kwon | H02J 5/005 |
| | | | 307/104 |
| 2016/0241086 A1* | 8/2016 | Jung | H02J 50/12 |

* cited by examiner

# DEVICE DETECTION THROUGH DYNAMIC IMPEDANCE CHANGE MEASUREMENT

CROSS-REFERENCE TO RELATED APPLICATION

This application claims priority under 35 U.S.C. § 119(e) to U.S. Provisional Application No. 61/940,254, filed Feb. 14, 2014, which is hereby expressly incorporated by reference herein.

FIELD

The present invention relates generally to wireless power. More specifically, the disclosure is directed to the detection of wireless power receivers that have been placed on or near a wireless power transmitter.

BACKGROUND

An increasing number and variety of electronic devices are powered via rechargeable batteries. Such devices include mobile phones, portable music players, laptop computers, tablet computers, computer peripheral devices, communication devices (e.g., Bluetooth devices), digital cameras, hearing aids, and the like. While battery technology has improved, battery-powered electronic devices increasingly require and consume greater amounts of power, thereby often requiring recharging. Rechargeable devices are often charged via wired connections through cables or other similar connectors that are physically connected to a power supply. Cables and similar connectors may sometimes be inconvenient or cumbersome and have other drawbacks. Wireless charging systems that are capable of transferring power in free space to be used to charge rechargeable electronic devices or provide power to electronic devices may overcome some of the deficiencies of wired charging solutions. As such, wireless power transfer systems and methods that efficiently and safely transfer power to electronic devices are desirable. In this context, there remains a need for detecting electronic devices placed on or near a wireless charger or transmitter.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a device for detecting placement of a wireless power receiver in a charging region of a wireless power transmitter. For example, device may comprise a transmit circuit comprising a transmit coil and configured to wirelessly transmit power via a wireless field applied to the charging region to a receive coil of the receiver. The device may further comprise a detection circuit configured to detect a characteristic waveform resulting from the field that is applied to the charging region or changed between the transmit and receive coils, in response to the receiver being placed in the charging region.

In relates aspects, the disclosure provides an apparatus for detecting placement of a wireless power receiver in a charging region. For example, the apparatus may include means for transmitting power via a wireless field applied to the charging region to a receive coil of the receiver. The apparatus may include means for detecting a characteristic waveform resulting from the field that is applied to the charging region or changed between the means for transmitting and the receive coil, in response to the receiver being placed in the charging region.

Another aspect of the disclosure provides a method for detecting placement of a wireless power receiver in a charging region of a wireless power transmitter. For example, the method may involve transmitting power via a wireless field applied to the charging region to a receive coil of the receiver via a transmit coil of a transmit circuit. The method may involve detecting a characteristic waveform resulting from the field that is applied to the charging region or changed between the transmit and receive coils, in response to the receiver being placed in the charging region.

Yet another aspect of the present disclosure provides a non-transitory computer readable medium comprising code that, when executed, causes an apparatus to detect placement of a wireless power receiver in a charging region of a wireless power transmitter. For example, the code, when executed, may cause the apparatus to transmit power via a wireless field applied to a charging region to a receive coil of a receiver. The code, when executed, may cause the apparatus to detect a characteristic waveform resulting from the field that is applied to the charging region or changed between the means for transmitting and the receive coil, in response to the receiver being placed in the charging region.

Figure 1:
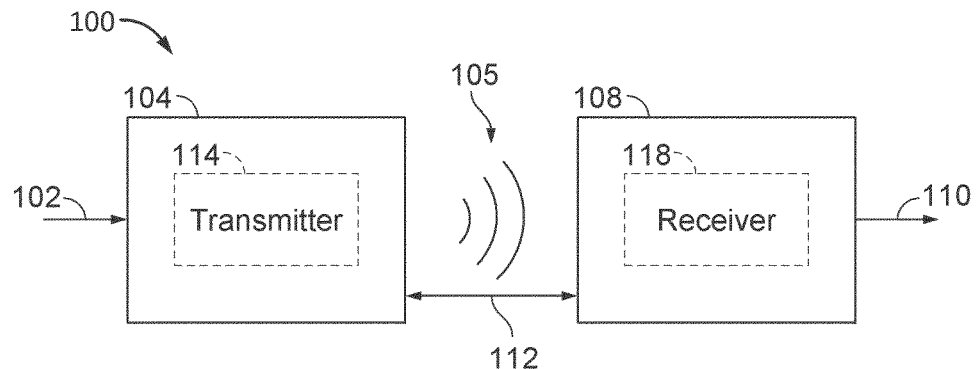
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving antenna" to achieve power transfer.

FIG. 1 is a functional block diagram of an exemplary wireless power transfer system 100, in accordance with exemplary embodiments of the invention. Input power 102 may be provided to a transmitter 104 from a power source (not shown) for generating a field 105 for providing energy transfer. A receiver 108 may couple to the field 105 and generate output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship. When the resonant frequency of receiver 108 and the resonant frequency of transmitter 104 are substantially the same or very close, transmission losses between the transmitter 104 and the receiver 108 are minimal. As such, wireless power transfer may be provided over larger distance in contrast to purely inductive solutions that may require large coils to be very close (e.g., mms). Resonant inductive coupling techniques may thus allow for improved efficiency and power transfer over various distances and with a variety of inductive coil configurations.

The receiver 108 may receive power when the receiver 108 is located in an energy field 105 produced by the transmitter 104. The field 105 corresponds to a region where energy output by the transmitter 104 may be captured by a receiver 105. In some cases, the field 105 may correspond to the "near-field" of the transmitter 104 as will be further described below. The transmitter 104 may include a transmit antenna 114 for outputting an energy transmission. The receiver 108 further includes a receive antenna 118 for receiving or capturing energy from the energy transmission. The near-field may correspond to a region in which there are strong reactive fields resulting from the currents and charges in the transmit antenna 114 that minimally radiate power away from the transmit antenna 114. In some cases the near-field may correspond to a region that is within about one wavelength (or a fraction thereof) of the transmit antenna 114. The transmit and receive antennas 114 and 118 are sized according to applications and devices to be associated therewith. As described above, efficient energy transfer may occur by coupling a large portion of the energy in a field 105 of the transmit antenna 114 to a receive antenna 118 rather than propagating most of the energy in an electromagnetic wave to the far field. When positioned within the field 105, a "coupling mode" may be developed between the transmit antenna 114 and the receive antenna 118. The area around the transmit and receive antennas 114 and 118 where this coupling may occur is referred to herein as a coupling-mode region.

Figure 2:
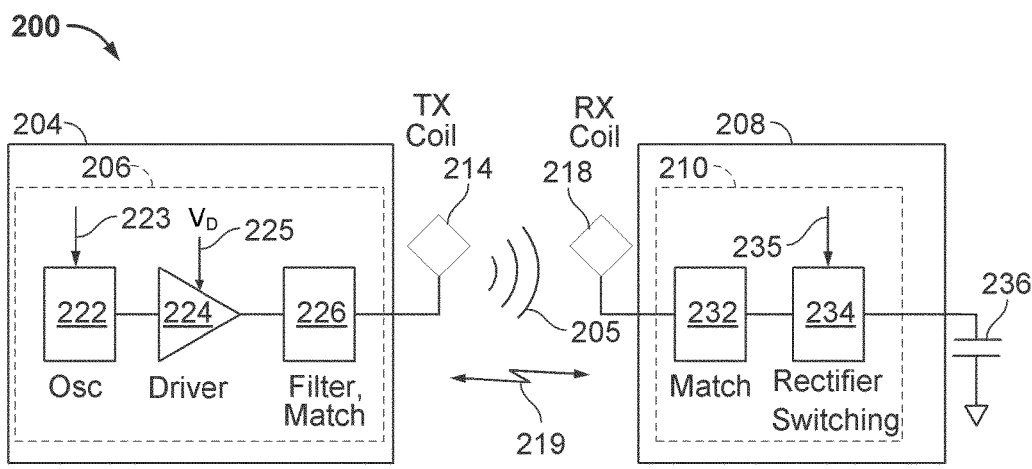
FIG. 2 is a functional block diagram of exemplary components that may be used in the wireless power transfer system of FIG. 1, in accordance with various exemplary embodiments of the invention.

FIG. 2 is a functional block diagram of exemplary components that may be used in the wireless power transfer system 100 of FIG. 1, in accordance with various exemplary embodiments of the invention. The transmitter 204 may include transmit circuitry 206 that may include an oscillator 222, a driver circuit 224, and a filter and matching circuit 226. The oscillator 222 may be configured to generate a signal at a desired frequency, such as 468.75 KHz, 6.78 MHz or 13.56 MHz, that may be adjusted in response to a frequency control signal 223. The oscillator signal may be provided to a driver circuit 224 configured to drive the transmit antenna 214 at, for example, a resonant frequency of the transmit antenna 214. The driver circuit 224 may be a switching amplifier configured to receive a square wave from the oscillator 222 and output a sine wave. For example, the driver circuit 224 may be a class E amplifier. A filter and matching circuit 226 may be also included to filter out harmonics or other unwanted frequencies and match the impedance of the transmitter 204 to the transmit antenna 214. As a result of driving the transmit antenna 214, the transmitter 204 may wirelessly output power at a level sufficient for charging or powering an electronic device. As one example, the power provided may be for example on the order of 300 milliWatts to 5 Watts to power or charge different devices with different power requirements. Higher or lower power levels may also be provided.

The receiver 208 may include receive circuitry 210 that may include a matching circuit 232 and a rectifier and switching circuit 234 to generate a DC power output from an AC power input to charge a battery 236 as shown in FIG. 2 or to power a device (not shown) coupled to the receiver 108. The matching circuit 232 may be included to match the impedance of the receive circuitry 210 to the receive antenna 218. The receiver 208 and transmitter 204 may additionally communicate on a separate communication channel 219 (e.g., Bluetooth, zigbee, cellular, etc). The receiver 208 and transmitter 204 may alternatively communicate via in-band signaling using characteristics of the wireless field 206.

As described more fully below, receiver 208, that may initially have a selectively disableable associated load (e.g., battery 236), may be configured to determine whether an amount of power transmitted by transmitter 204 and received by receiver 208 is appropriate for charging a battery 236. Further, receiver 208 may be configured to enable a load (e.g., battery 236) upon determining that the amount of power is appropriate. In some embodiments, a receiver 208 may be configured to directly utilize power received from a wireless power transfer field without charging of a battery 236. For example, a communication device, such as a near-field communication (NFC) or radio-frequency identification device (RFID may be configured to receive power from a wireless power transfer field and communicate by interacting with the wireless power transfer field and/or utilize the received power to communicate with a transmitter 204 or other devices.

Figure 3:
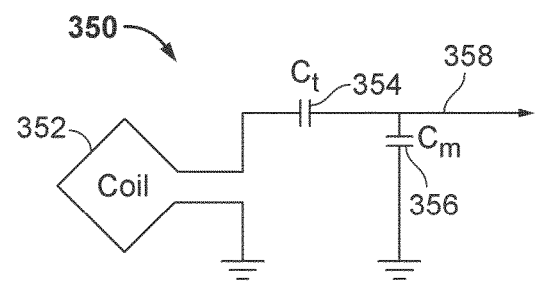
FIG. 3 is a schematic diagram of a portion of transmit circuitry or receive circuitry of FIG. 2 including a transmit or receive antenna, in accordance with exemplary embodiments of the invention.

FIG. 3 is a schematic diagram of a portion of transmit circuitry 206 or receive circuitry 210 of FIG. 2 including a transmit or receive antenna 352, in accordance with exemplary embodiments of the invention. As illustrated in FIG. 3, transmit or receive circuitry 350 used in exemplary embodiments including those described below may include an antenna 352. The antenna 352 may also be referred to or be configured as a "loop" antenna 352. The antenna 352 may also be referred to herein or be configured as a "magnetic" antenna or an induction coil. The term "antenna" generally refers to a component that may wirelessly output or receive energy for coupling to another "antenna." The antenna may also be referred to as a coil of a type that is configured to wirelessly output or receive power. As used herein, an antenna 352 is an example of a "power transfer component" of a type that is configured to wirelessly output and/or receive power. The antenna 352 may be configured to include an air core or a physical core such as a ferrite core (not shown). Air core loop antennas may be more tolerable to extraneous physical devices placed in the vicinity of the core. Furthermore, an air core loop antenna 352 allows the placement of other components within the core area. In addition, an air core loop may more readily enable placement of the receive antenna 218 (FIG. 2) within a plane of the transmit antenna 214 (FIG. 2) where the coupled-mode region of the transmit antenna 214 (FIG. 2) may be more powerful.

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the field 105 of the transmit antenna 214 coil to the receive antenna 218 residing in the neighborhood where this field 105 is established rather than propagating the energy from the transmit antenna 214 into free space.

The resonant frequency of the loop or magnetic antennas is based on the inductance and capacitance. Inductance may be simply the inductance created by the antenna 352, whereas, capacitance may be added to the antenna's inductance to create a resonant structure at a desired resonant frequency. As a non-limiting example, capacitor 352 and capacitor 354 may be added to the transmit or receive circuitry 350 to create a resonant circuit that selects a signal 356 at a resonant frequency. Accordingly, for larger diameter antennas, the size of capacitance needed to sustain resonance may decrease as the diameter or inductance of the loop increases. Furthermore, as the diameter of the antenna increases, the efficient energy transfer area of the near-field may increase. Other resonant circuits formed using other components are also possible. As another non-limiting example, a capacitor may be placed in parallel between the two terminals of the antenna 350. For transmit antennas, a signal 358 with a frequency that substantially corresponds to the resonant frequency of the antenna 352 may be an input to the antenna 352.

In one embodiment, the transmitter 104 may be configured to output a time varying magnetic field with a frequency corresponding to the resonant frequency of the transmit antenna 114. When the receiver is within the field 105, the time varying magnetic field may induce a current in the receive antenna 118. As described above, if the receive antenna 118 is configured to be resonant at the frequency of the transmit antenna 118, energy may be efficiently transferred. The AC signal induced in the receive antenna 118 may be rectified as described above to produce a DC signal that may be provided to charge or to power a load.

Figure 4:
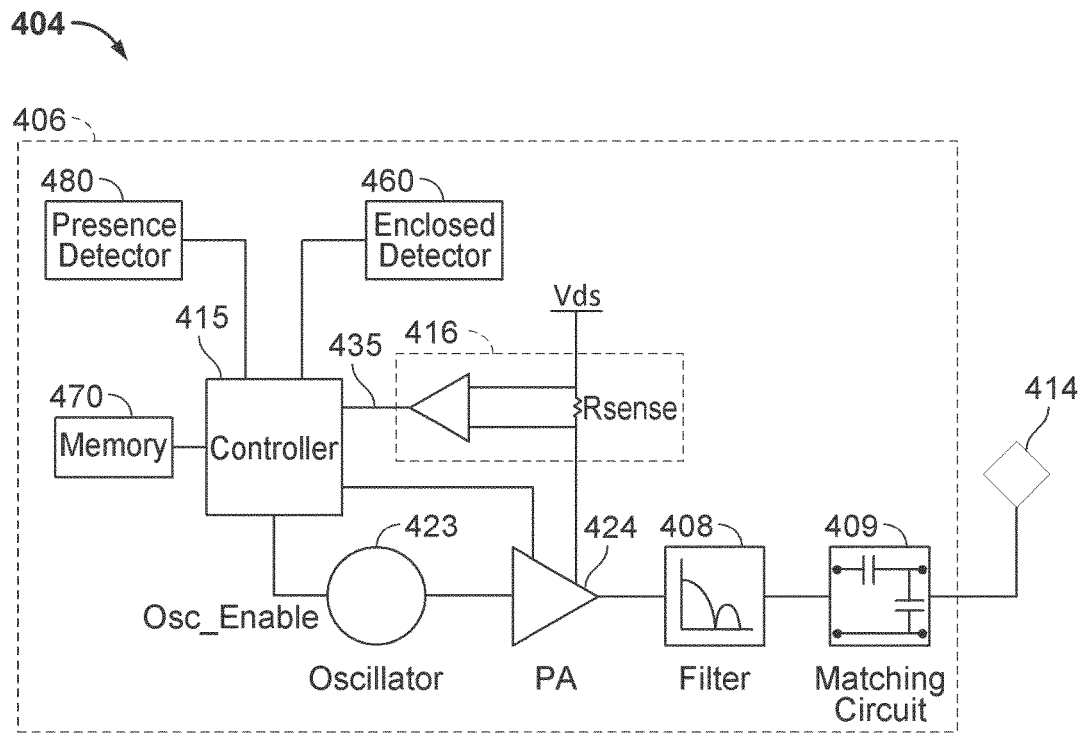
FIG. 4 is a functional block diagram of a transmitter that may be used in the wireless power transfer system of FIG. 1, in accordance with exemplary embodiments of the invention.

FIG. 4 is a functional block diagram of a transmitter 404 that may be used in the wireless power transfer system of FIG. 1, in accordance with exemplary embodiments of the invention. The transmitter 404 may include transmit circuitry 406 and a transmit antenna 414. The transmit antenna 414 may be the antenna 352 as shown in FIG. 3. Transmit circuitry 406 may provide RF power to the transmit antenna 414 by providing an oscillating signal resulting in generation of energy (e.g., magnetic flux) about the transmit antenna 414. Transmitter 404 may operate at any suitable frequency. By way of example, transmitter 404 may operate at the 6.78 MHz ISM band.

Transmit circuitry 406 may include a fixed impedance matching circuit 409 for matching the impedance of the transmit circuitry 406 (e.g., 50 ohms) to the transmit antenna 414 and a low pass filter (LPF) 408 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that may be varied based on measurable transmit metrics, such as output power to the antenna 414 or DC current drawn by the driver circuit 424. Transmit circuitry 406 further includes a driver circuit 424 configured to drive an RF signal as determined by an oscillator 423. The transmit circuitry 406 may be comprised of discrete devices or circuits, or alternately, may be comprised of an integrated assembly. An exemplary RF power output from transmit antenna 414 may be on the order of 2.5 Watts.

Transmit circuitry 406 may further include a controller 415 for selectively enabling the oscillator 423 during transmit phases (or duty cycles) for specific receivers, for adjusting the frequency or phase of the oscillator 423, and for adjusting the output power level for implementing a communication protocol for interacting with neighboring devices through their attached receivers. It is noted that the controller 415 may also be referred to herein as processor 415. Adjustment of oscillator phase and related circuitry in the transmission path may allow for reduction of out of band emissions, especially when transitioning from one frequency to another.

The transmit circuitry 406 may further include a load sensing circuit 416 for detecting the presence or absence of active receivers in the vicinity of the near-field generated by transmit antenna 414. By way of example, a load sensing circuit 416 monitors the current flowing to the driver circuit 424, that may be affected by the presence or absence of active receivers in the vicinity of the field generated by transmit antenna 414 as will be further described below. Detection of changes to the loading on the driver circuit 424 are monitored by controller 415 for use in determining whether to enable the oscillator 423 for transmitting energy and to communicate with an active receiver. As described more fully below, a current measured at the driver circuit 424 may be used to determine whether an invalid device is positioned within a wireless power transfer region of the transmitter 404.

The transmit antenna 414 may be implemented with a Litz wire or as an antenna strip with the thickness, width and metal type selected to keep resistive losses low. In one implementation, the transmit antenna 414 may generally be configured for association with a larger structure such as a table, mat, lamp or other less portable configuration. Accordingly, the transmit antenna 414 generally may not need "turns" in order to be of a practical dimension. An exemplary implementation of a transmit antenna 414 may be "electrically small" (i.e., fraction of the wavelength) and tuned to resonate at lower usable frequencies by using capacitors to define the resonant frequency.

The transmitter 404 may gather and track information about the whereabouts and status of receiver devices that may be associated with the transmitter 404. Thus, the transmit circuitry 406 may include a presence detector 480, an enclosed detector 460, or a combination thereof, connected to the controller 415 (also referred to as a processor herein). The controller 415 may adjust an amount of power delivered by the driver circuit 424 in response to presence signals from the presence detector 480 and the enclosed detector 460. The transmitter 404 may receive power through a number of power sources, such as, for example, an AC-DC converter (not shown) to convert conventional AC power present in a building, a DC-DC converter (not shown) to convert a conventional DC power source to a voltage suitable for the transmitter 404, or directly from a conventional DC power source (not shown).

As a non-limiting example, the presence detector 480 may be a motion detector utilized to sense the initial presence of a device to be charged that is inserted into the coverage area of the transmitter 404. After detection, the transmitter 404 may be turned on and the RF power received by the device may be used to toggle a switch on the Rx device in a pre-determined manner, which in turn results in changes to the driving point impedance of the transmitter 404.

As another non-limiting example, the presence detector 480 may be a detector capable of detecting a human, for example, by infrared detection, motion detection, or other suitable means. In some exemplary embodiments, there may be regulations limiting the amount of power that a transmit antenna 414 may transmit at a specific frequency. In some cases, these regulations are meant to protect humans from electromagnetic radiation. However, there may be environments where a transmit antenna 414 is placed in areas not occupied by humans, or occupied infrequently by humans, such as, for example, garages, factory floors, shops, and the like. If these environments are free from humans, it may be permissible to increase the power output of the transmit antenna 414 above the normal power restrictions regulations. In other words, the controller 415 may adjust the power output of the transmit antenna 414 to a regulatory level or lower in response to human presence and adjust the power output of the transmit antenna 414 to a level above the regulatory level when a human is outside a regulatory distance from the electromagnetic field of the transmit antenna 414.

As a non-limiting example, the enclosed detector 460 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In accordance with one or more aspects of the present disclosure, the load sensing circuit 416 may include circuitry configured to detect a dynamic impedance change resulting from a field that is applied or changed between transmit and receive coils of the transmitter 404 and a receiver (e.g., receiver 508 of FIG. 5), respectively, in response to the receiver being placed in a charging region of the transmitter 404. In one implementation, the load sensing circuit 416 may include circuitry configured to detect a change in impedance presented to the transmitter, the change resulting from a field that is applied to the charging region or changed between the transmit and receive coils, in response to the receiver being placed in the charging region. In related aspects, the load sensing circuit 416 may detect an impedance change pattern (not necessarily including a repeating waveform or shape) within a time interval and/or a type of impedance response within the time interval. For example, the dynamic impedance change by recognizing a characteristic waveform associated with a charging of a capacitor (e.g., a filter capacitor) of the receiver during initial application of the field. In further related aspects, the characteristic waveform may relate to or be based on the output impedance, the transmitter current, and/or the transmitter voltage. For example, the characteristic waveform may include a transient spike in a transmitter current to the receiver. The load sensing circuit 416 may operate in conjunction with the controller 415 to switch the transmitter 404 from a power-save mode to a full-charging mode, in response to the receiver being in the charging region.

In related aspects, the load sensing circuit 416 or the like may operate in conjunction with one or more components of the transmitter 404, illustrated or otherwise. In further related aspects, the load sensing circuit 416 or the like may be configured to detect placement of the receiver in the charging region of the 404 transmitter according to the features described in further detail below with reference to FIGS. 7A-13.

In exemplary embodiments, a method by which the transmitter 404 does not remain on indefinitely may be used. In this case, the transmitter 404 may be programmed to shut off after a user-determined amount of time. This feature prevents the transmitter 404, notably the driver circuit 424, from running long after the wireless devices in its perimeter are fully charged. This event may be due to the failure of the circuit to detect the signal sent from either the repeater or the receive antenna 218 that a device is fully charged. To prevent the transmitter 404 from automatically shutting down if another device is placed in its perimeter, the transmitter 404 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
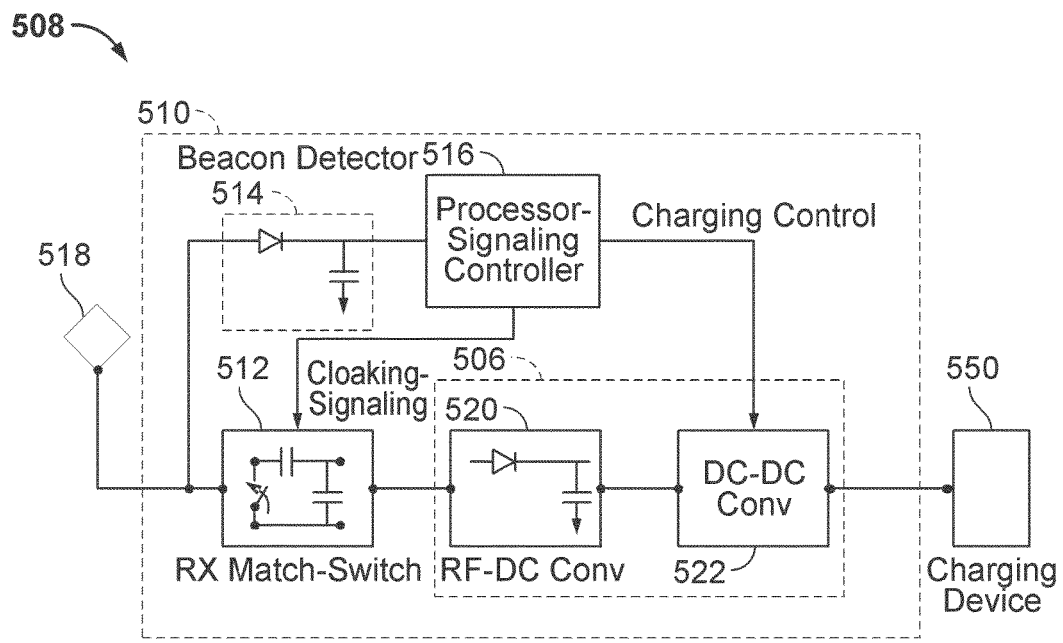
FIG. 5 is a functional block diagram of a receiver that may be used in the wireless power transfer system of FIG. 1, in accordance with exemplary embodiments of the invention.

FIG. 5 is a functional block diagram of a receiver 508 that may be used in the wireless power transfer system of FIG. 1, in accordance with exemplary embodiments of the invention. The receiver 508 includes receive circuitry 510 that may include a receive antenna 518. Receiver 508 further couples to device 550 for providing received power thereto. It should be noted that receiver 508 is illustrated as being external to device 550 but may be integrated into device 550. Energy may be propagated wirelessly to receive antenna 518 and then coupled through the rest of the receive circuitry 510 to device 550. By way of example, the charging device may include devices such as mobile phones, portable music players, laptop computers, tablet computers, computer peripheral devices, communication devices (e.g., Bluetooth devices), digital cameras, hearing aids (or other medical devices), and the like.

Receive antenna 518 may be tuned to resonate at the same frequency, or within a specified range of frequencies, as transmit antenna 414 (FIG. 4). Receive antenna 518 may be similarly dimensioned with transmit antenna 414 or may be differently sized based upon the dimensions of the associated device 550. By way of example, device 550 may be a portable electronic device having diametric or length dimension smaller than the diameter or length of transmit antenna 414. In such an example, receive antenna 518 may be implemented as a multi-turn coil in order to reduce the capacitance value of a tuning capacitor (not shown) and increase the receive coil's impedance. By way of example, receive antenna 518 may be placed around the substantial circumference of device 550 in order to maximize the antenna diameter and reduce the number of loop turns (i.e., windings) of the receive antenna 518 and the inter-winding capacitance.

Receive circuitry 510 may provide an impedance match to the receive antenna 518. Receive circuitry 510 includes power conversion circuitry 506 for converting a received RF energy source into charging power for use by the device 550. Power conversion circuitry 506 includes an RF-to-DC converter 520 and may also include a DC-to-DC converter 522. RF-to-DC converter 520 rectifies the RF energy signal received at receive antenna 518 into a non-alternating power with an output voltage represented by $V_{rect}$. The DC-to-DC converter 522 (or other power regulator) converts the rectified RF energy signal into an energy potential (e.g., voltage) that is compatible with device 550 with an output voltage and output current represented by $V_{out}$ and $I_{out}$. Various RF-to-DC converters are contemplated, including partial and full rectifiers, regulators, bridges, doublers, as well as linear and switching converters.

Receive circuitry 510 may further include switching circuitry 512 for connecting receive antenna 518 to the power conversion circuitry 506 or alternatively for disconnecting the power conversion circuitry 506. Disconnecting receive antenna 518 from power conversion circuitry 506 not only suspends charging of device 550, but also changes the "load" as "seen" by the transmitter 404 (FIG. 2).

As disclosed above, transmitter 404 includes load sensing circuit 416 that may detect fluctuations in the bias current provided to transmitter driver circuit 424. Accordingly, transmitter 404 has a mechanism for determining when receivers are present in the transmitter's near-field.

When multiple receivers 508 are present in a transmitter's near-field, it may be desirable to time-multiplex the loading and unloading of one or more receivers to enable other receivers to more efficiently couple to the transmitter. A receiver 508 may also be cloaked in order to eliminate coupling to other nearby receivers or to reduce loading on nearby transmitters. This "unloading" of a receiver is also known herein as a "cloaking." Furthermore, this switching between unloading and loading controlled by receiver 508 and detected by transmitter 404 may provide a communication mechanism from receiver 508 to transmitter 404 as is explained more fully below. Additionally, a protocol may be associated with the switching that enables the sending of a message from receiver 508 to transmitter 404. By way of example, a switching speed may be on the order of 100 μsec.

In an exemplary embodiment, communication between the transmitter 404 and the receiver 508 refers to a device sensing and charging control mechanism, rather than conventional two-way communication (i.e., in band signaling using the coupling field). In other words, the transmitter 404 may use on/off keying of the transmitted signal to adjust whether energy is available in the near-field. The receiver may interpret these changes in energy as a message from the transmitter 404. From the receiver side, the receiver 508 may use tuning and de-tuning of the receive antenna 518 to adjust how much power is being accepted from the field. In some cases, the tuning and de-tuning may be accomplished via the switching circuitry 512. The transmitter 404 may detect this difference in power used from the field and interpret these changes as a message from the receiver 508. It is noted that other forms of modulation of the transmit power and the load behavior may be utilized.

Receive circuitry 510 may further include signaling detector and beacon circuitry 514 used to identify received energy fluctuations that may correspond to informational signaling from the transmitter to the receiver. Furthermore, signaling and beacon circuitry 514 may also be used to detect the transmission of a reduced RF signal energy (i.e., a beacon signal) and to rectify the reduced RF signal energy into a nominal power for awakening either un-powered or power-depleted circuits within receive circuitry 510 in order to configure receive circuitry 510 for wireless charging.

Receive circuitry 510 further includes processor 516 for coordinating the processes of receiver 508 described herein including the control of switching circuitry 512 described herein. Cloaking of receiver 508 may also occur upon the occurrence of other events including detection of an external wired charging source (e.g., wall/USB power) providing charging power to device 550. Processor 516, in addition to controlling the cloaking of the receiver, may also monitor beacon circuitry 514 to determine a beacon state and extract messages sent from the transmitter 404. Processor 516 may also adjust the DC-to-DC converter 522 for improved performance.

Figure 6:
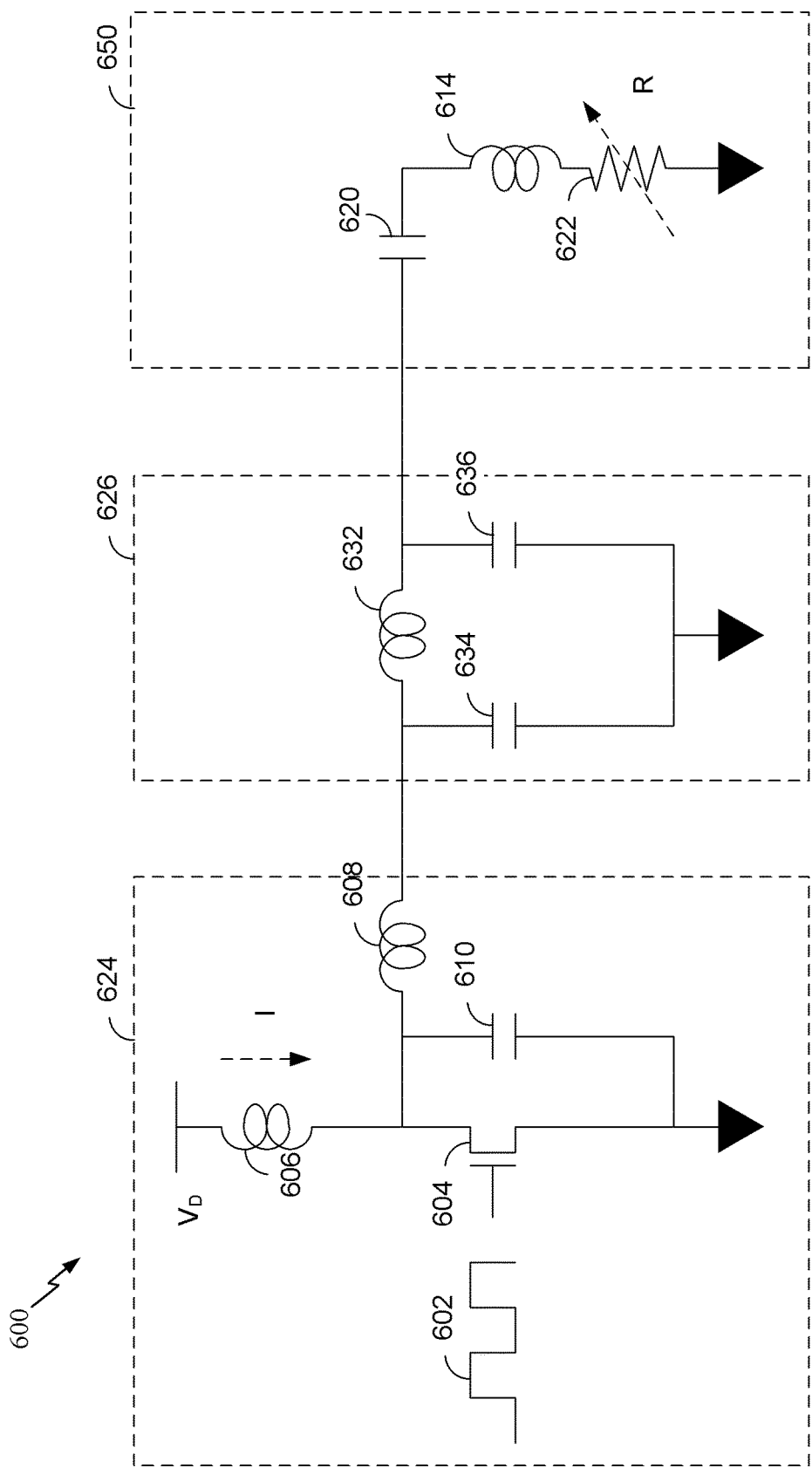
FIG. 6 is a schematic diagram of a portion of transmit circuitry that may be used in the transmit circuitry of FIG. 4.

FIG. 6 is a schematic diagram of a portion of transmit circuitry 600 that may be used in the transmit circuitry 406 of FIG. 4. The transmit circuitry 600 may include a driver circuit 624 as described above in FIG. 4. As described above, the driver circuit 624 may be a switching amplifier that may be configured to receive a square wave and output a sine wave to be provided to the transmit circuit 650. In some cases the driver circuit 624 may be referred to as an amplifier circuit. The driver circuit 624 is shown as a class E amplifier; however, any suitable driver circuit 624 may be used in accordance with embodiments of the invention. The driver circuit 624 may be driven by an input signal 602 from an oscillator 423 as shown in FIG. 4. The driver circuit 624 may also be provided with a drive voltage $V_D$ that is configured to control the maximum power that may be delivered through a transmit circuit 650. To eliminate or reduce harmonics, the transmit circuitry 600 may include a filter circuit 626. The filter circuit 626 may be a three pole (capacitor 634, inductor 632, and capacitor 636) low pass filter circuit 626.

The signal output by the filter circuit 626 may be provided to a transmit circuit 650 comprising an antenna 614. The transmit circuit 650 may include a series resonant circuit having a capacitance 620 and inductance (e.g., that may be due to the inductance or capacitance of the antenna or to an additional capacitor component) that may resonate at a frequency of the filtered signal provided by the driver circuit 624. The load of the transmit circuit 650 may be represented by the variable resistor 622. The load may be a function of a wireless power receiver 508 that is positioned to receive power from the transmit circuit 650.

With this disclosure, it is desirable to improve the following aspects of the detection of power receiver(s) in a charging region of a wireless power transmitter, such as, for example, a charging pad. With wireless power systems, it is desirable to detect devices that have been placed in the charging region of a charging pad. Some wireless chargers go to a lower power state when there are no devices on the charging pad. This reduces quiescent power dissipation, which in turn increases overall efficiency, such as, for example, over the course of several days.

However, when the charger pad is in this lower power state, it can be more difficult to detect devices being placed in the charging region, since the RF energy may be absent, absent for most of the time, or at a much lower level than when the charger pad is turned on. This means a user might place a device on a pad and have the charger pad not turn back on, or take a long time to turn back on. This may result in a delay in charging and a poor user experience.

One way this is overcome is by measuring the load placed on the charger's RF field by a device being placed in the charging region. When a charger generates a charging field (even a weak or intermittent one) an object within that field causes a change in the observed impedance. If the charger detects a change in impedance over a certain limit, then it can turn on and power the load. As used herein, impedance may refer to both the real impedance (resistance) and/or the imaginary impedance (reactance). The system may be configured to detect or observe a change in either type of impedance for purposes of powering on when the device is place in the charging region.

While the above-described approach may work in many cases, there are situations where issues may arise. For example, a small device placed on a large charging pad may not generate enough of an impedance change to signal or trigger the charging pad to begin charging. In another example, certain designs of the charging pad (or the receiving device) may be specifically intended to minimize impedance change in order to improve efficiency. In yet another example, foreign objects (e.g., coins, keys, etc.) on the charger pad may cause a reactance shift, which may cause the system to begin charging without the device in the charging region.

To overcome the issues with existing approaches for detecting power receiving devices on/near the charging pad or the like, this disclosure describes improvements below. In this disclosure, the following described methods and approaches below can be used solely or in any combination.

In accordance with one aspect of this disclosure, there is provided a technique that involves measuring a parameter different than the power receiving device's steady state impedance to detect the power receiving device. Wireless power receivers include rectification and filtering to transform received RF energy back to useful DC power. This means that at initial power-on, the filter capacitor may present a much lower impedance than would be detected during steady state operation. The effect of this temporary lower impedance can be detected and used to determine, for example, whether a device has been placed on a charging pad. For example, the much lower impedance of the filter capacitor of the power receiving device at initial power-on, relative to at steady state operation, may result in a measurable or detectable effect in the form of a transient or short term impedance change.

There are several advantages to this approach. First, since an unloaded pad appears to the transmitter as an open circuit, the near short circuit presented by the uncharged capacitor will result in a much larger impedance change, making it easier to detect. Second, since foreign objects (e.g., coins) generally will not contain rectifiers or capacitors, this short term impedance change is an effective way to verify that a new object on a charging pad is in fact a power receiver and not a coin or the like. Many foreign objects contain metal and will cause an impedance change. Third, the approach for detecting the short term impedance change does not require specialized or additional hardware on the receiver side.

Figure 7:
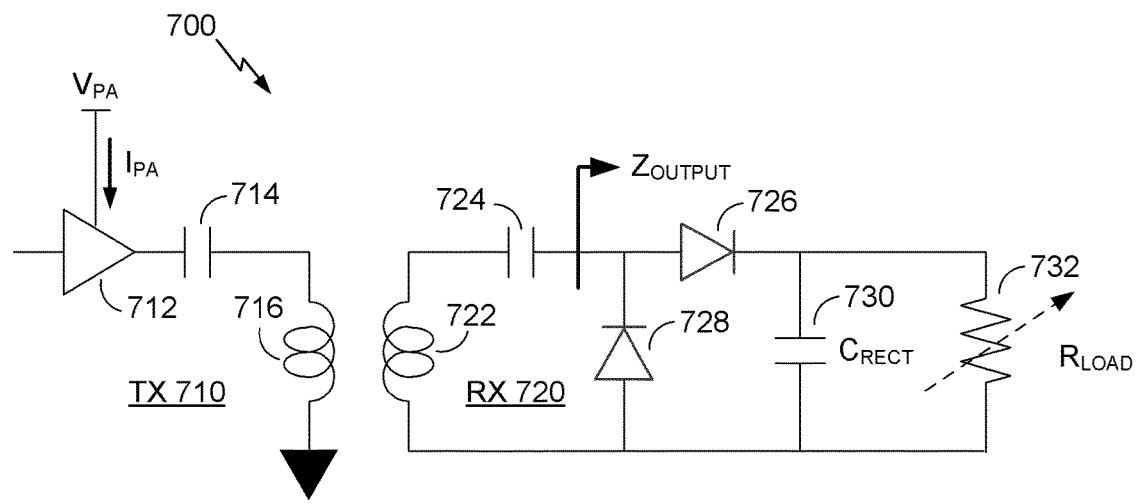
FIG. 7 is a simplified exemplary wireless charging circuit.

FIG. 7 provides a simplified schematic of an example wireless power system 700 with the transmitter 710 is on the left side and the receiver 720 on the right side. The transmitter 710 includes a power amplifier (PA) 712 (corresponding to the switching amplifier of the driver circuit 624 in FIG. 6) coupled to a capacitor 714 (corresponding to the capacitor 620 of the transmit circuit 650 in FIG. 6, which is in turn coupled to an inductor 716 (corresponding to the inductor 614 of the transmit circuit 650 in FIG. 6), wherein the capacitor 714 and inductor 716 may collectively function as or correspond to the series resonant circuit having a capacitance 620 and inductor 614 that may resonate at a frequency of the filtered signal provided by the driver circuit 624 in FIG. 6. The capacitor 714 and the inductor 716 of the transmitter 710 form a resonant circuit where the inductor 716 may be formed of a coil used to generate a magnetic field for coupling wireless power to the receiver 720.

The receiver 720 includes an inductor 722 (which may be formed of a coil and coupled to and receive wireless power from the inductor 716 and may correspond to the antenna 518 of the receiver 500 in FIG. 5) coupled to a capacitor 724 (corresponding to the capacitor 354 or the capacitor 356 in FIG. 3), wherein the inductor 722 and the capacitor 724 form a resonant circuit at the receiver 720 and determine the resonant frequency of the resonant circuit. The resonant frequency is in turn coupled to diodes 726, 728 of a rectifier. The cathode of the diode 728 and the anode of diode 728 are coupled to a capacitor $C_{RECT}$ 730. The diodes 726, 728 and the capacitor $C_{RECT}$ 730 may form or be part of an RF-to-DC converter (correspond to the RF-to-DC converter 520 of the power conversion circuitry 506 in FIG. 5). The capacitor $C_{RECT}$ 730 in turn may be coupled in parallel to $R_{LOAD}$ 732. $Z_{OUTPUT}$ corresponds to the output impedance observed by the PA 712 looking into the rectifier.

Figure 8:
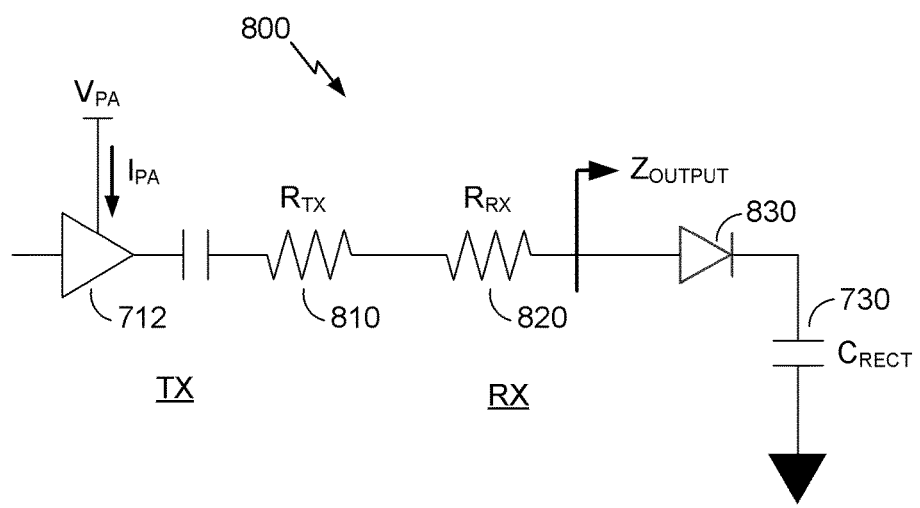
FIG. 8 is an equivalent DC model corresponding to the circuit of FIG. 7.

FIG. 8 shows an even more simplified representation of a wireless charging circuit 800, in which the coupling and losses in the transmit and receive resonators are shown as resistances $R_{TX}$ 810 and $R_{RX}$ 820. At the receiver, a diode 830 is coupled to a capacitor $C_{RECT}$ 730. The remaining circuit components are similar to those described above with reference to FIG. 7. It is noted that the combination of resistances and the capacitor may form an RC network with a predictable time constant. When looking into this RC network from the amplifier on the left, the observed impedance will start out low and then rise as the capacitor begins to charge.

Figure 9A:
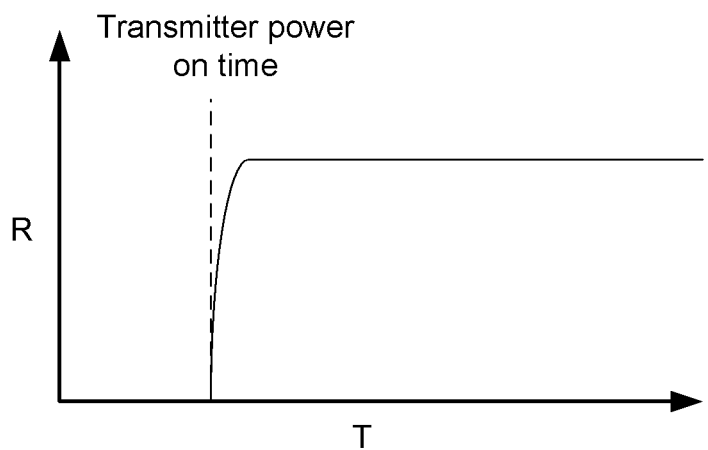
FIG. 9A is the observed output impedance looking into the rectifier without a wireless power receiver in a charging region of a wireless power transmitter.

The effect of the observed impedance starting out low and then rising is shown in FIG. 9A. When the PA first turns on in the case of the empty pad, normally the PA sees the same impedance with time. Resistance is sensed to be a specific value that does not change. In the case of a foreign object on the pad, the sensed resistance may be different but remain unchanging or constant. It is noted that complex impedance includes both resistance and reactance, wherein the resistance and/or reactance values can change.

Figure 9B:
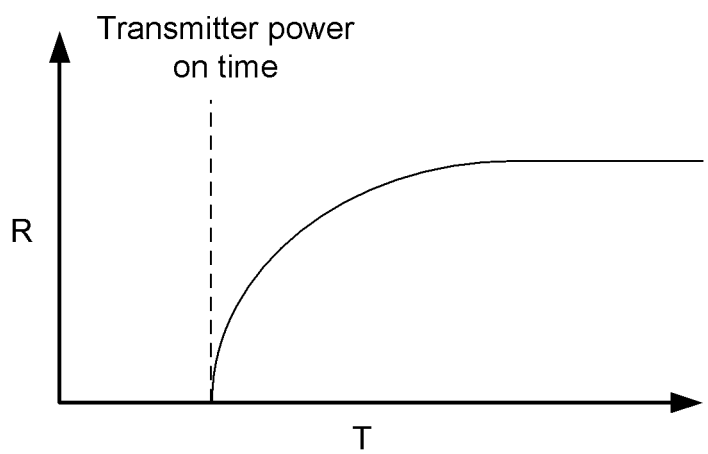
FIG. 9B is the observed output impedance looking into the rectifier with the wireless power receiver in the charging region of the wireless power transmitter.

In the example illustrated in FIG. 9B, a wireless power receiver is on the pad when the amplifier turns on. Due to the capacitor taking a finite amount of time to charge, the impedance starts out low, then ramps up to the final steady state value. A system, or component(s) thereof, may be configured to observe these specific type or pattern of responses and determine that the case in FIG. 9A does not represent a valid device on the pad, and that the system should remain in the low power state. In the alternative, or in addition, the system, or component(s) thereof, may be configured to determine that the case in FIG. 9B represents a valid device on the pad, and that the system should transition from a low power state to a full power/charging state.

Figure 10A:
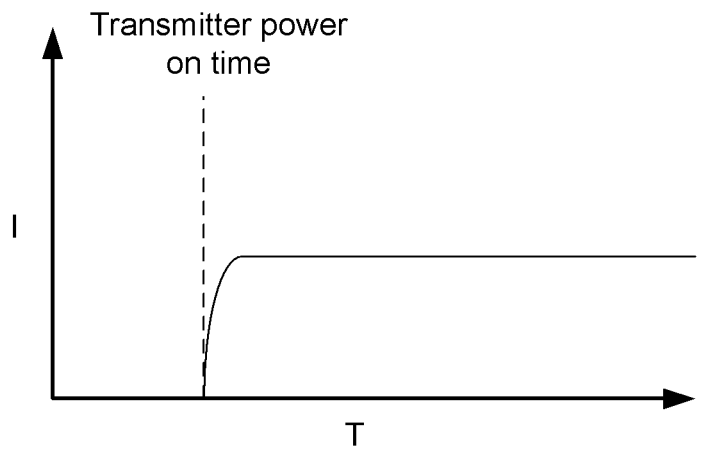
FIG. 10A is the transmitter power amplifier (PA) input current without the wireless power receiver in the charging region of a wireless power transmitter.
Figure 10B:
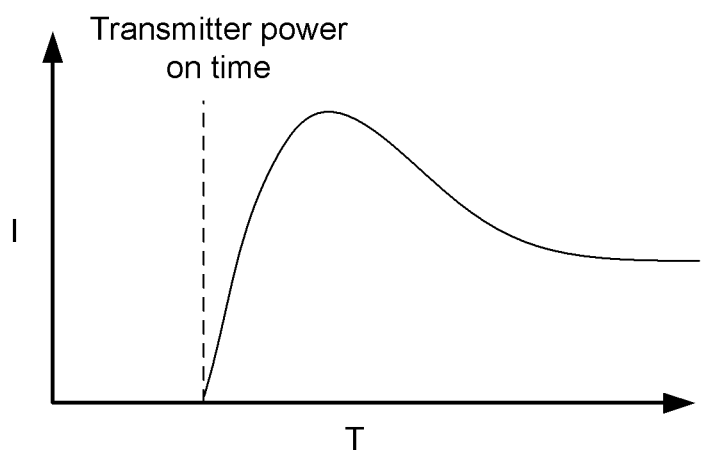
FIG. 10B is the transmitter PA input current with the wireless power receiver in the charging region of the wireless power transmitter.

In some cases, the transmitter may not be able to directly measure output impedance. In such a scenario, the system, or component(s) thereof, may be configured to measure proxy values, such as, for example, the transmitter PA input current, transmitter PA input voltage, or the like. During operation into a low impedance, a transmitter will typically use more current, resulting in a transient spike of higher current that can be detected and used in the same manner as the observed impedance. FIG. 10A illustrates the transmitter current over time for an example case where the power receiving device is not in the charging region of the charging pad. FIG. 10B illustrates the transmitter current over time for an example case where the transmitter current is delivered to the power receiving device in the charging region. As shown, a transient spike of higher current is observed in the cases where a valid wireless power receiver is in the charging region of the charging pad. A system, or component(s) thereof, may be configured to observe these specific type or pattern of responses and determine that the case in FIG. 10A does not represent a valid device on the pad, and that the system should remain in the low power state. In the alternative, or in addition, the system, or component(s) thereof, may be configured to determine that the case in FIG. 10B represents a valid device on the pad, and that the system should transition from a low power state to a full power/charging state.

Figure 11A:
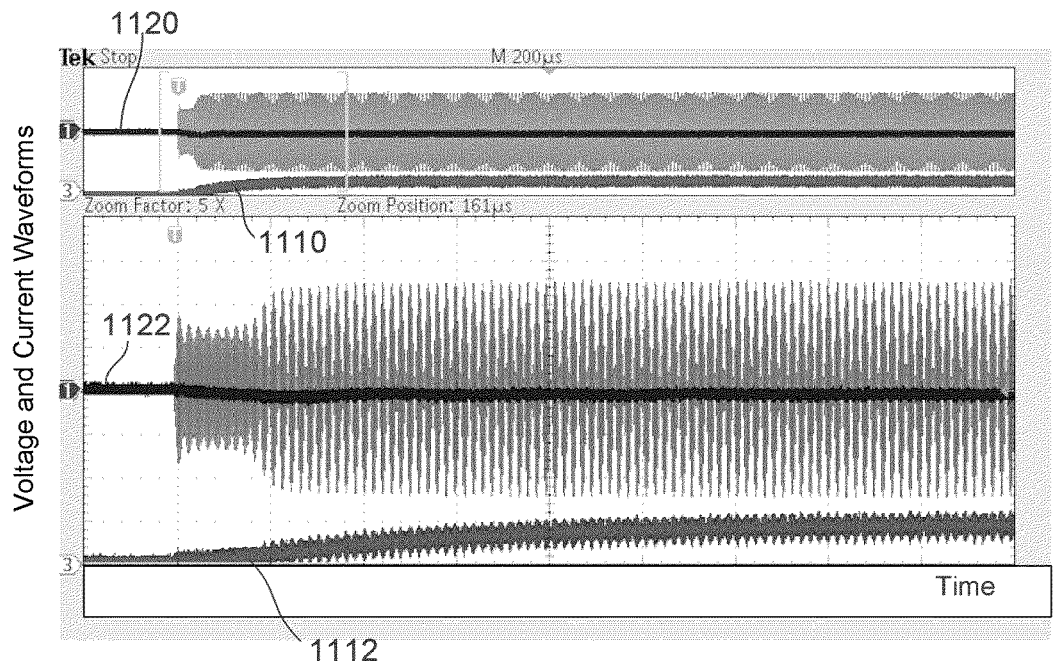
FIG. 11A is a trace of test measurements of the transmitter's PA input current and voltage without a wireless power receiver in the charging region of a wireless power transmitter.
Figure 11B:
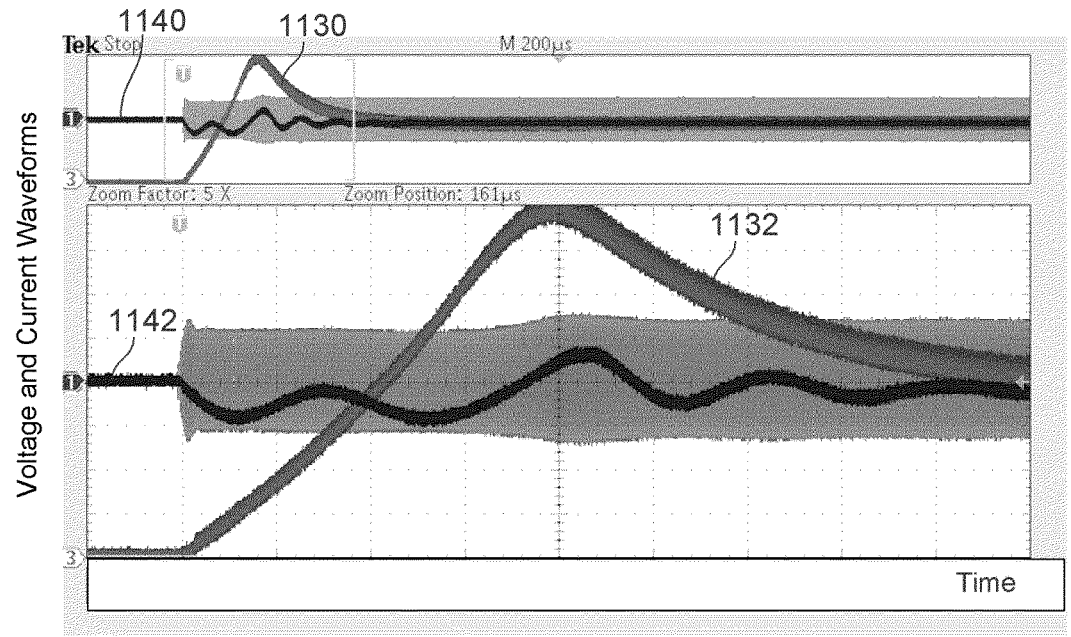
FIG. 11B is a trace of the test measurements of the transmitter's PA input current and voltage with the wireless power receiver in the charging region of the wireless power transmitter.

FIG. 11A shows example test measurements of the transmitter's PA input current 1110, 1112 and AC coupled PA input voltage 1120, 1122 for an empty charging pad. Traces 1112 and 1122 correspond to a zoomed in view of traces 1110 and 1120, respectively. It is noted that the current rises to a final value. The delay here is caused by the low bandwidth of the current sense circuitry. FIG. 11B shows example measurements of the transmitter's current 1130, 1132 and voltage 1140, 1142 when a wireless device has been placed on the charging pad. Traces 1132 and 1142 correspond to a zoomed in view of traces 1130 and 1140, respectively. It is noted that the initial spike in current is due to the low impedance caused by the charging capacitor.

Figure 12A:
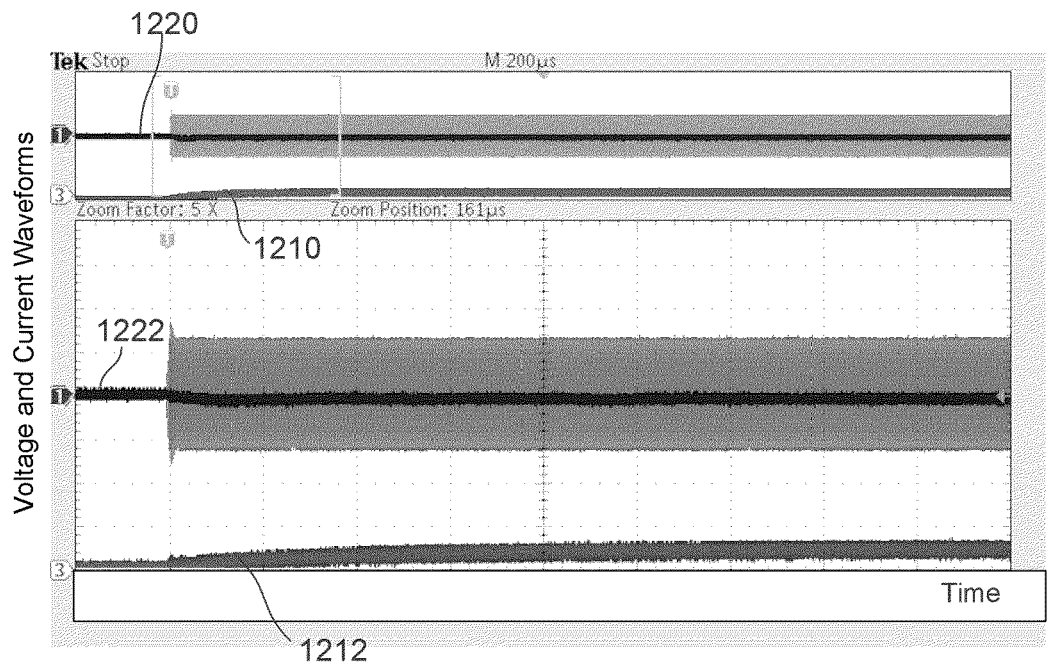
FIG. 12A is a trace of the test measurements of the transmitter's PA input current and voltage with a simulated rogue device in the charging region of the wireless power transmitter.
Figure 12B:
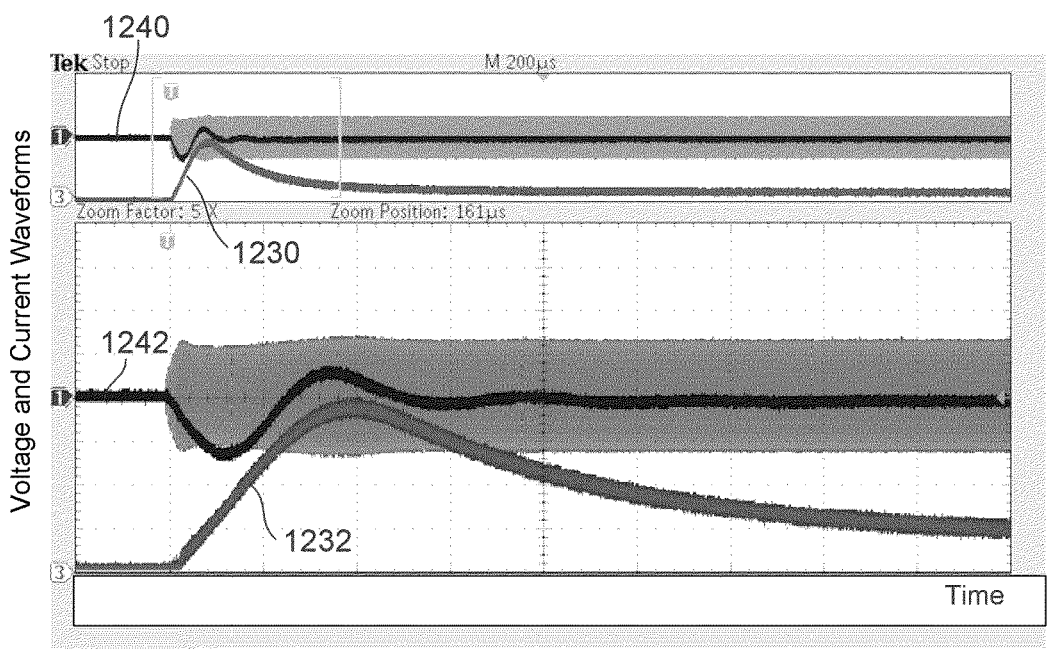
FIG. 12B is a trace of the test measurements of the transmitter's PA input current and voltage with a valid device in the charging region of the wireless power transmitter.

In FIGS. 12A-B, the transmitter's PA input current 1210, 1212 and AC coupled PA input voltage 1220, 1222 are again measured. Traces 1212 and 1222 correspond to a zoomed in view of traces 1210 and 1220, respectively. In the example of FIG. 12A, a rogue device (e.g., could be a metal object or some other device without appropriate receive circuitry) has been simulated by using a wireless power receiver with its rectifier and capacitor disconnected. As such, the rogue device "appears" as an open circuit. It is noted that the rogue device example of FIG. 12A looks very similar to the empty pad case of FIG. 11A. In such as case, a valid device would not be detected. In the example of FIG. 12B, the rectifier and capacitor have been reconnected, and the transmitter's current 1230, 1232 and voltage 1240, 1242 are again measured. Traces 1232 and 1242 correspond to a zoomed in view of traces 1230 and 1240, respectively. Again, it is noted that the initial spike in current due to the low impedance is caused by the charging capacitor. A characteristic waveform with such a spike allows for and facilitates the detection of a valid device.

Figure 13:
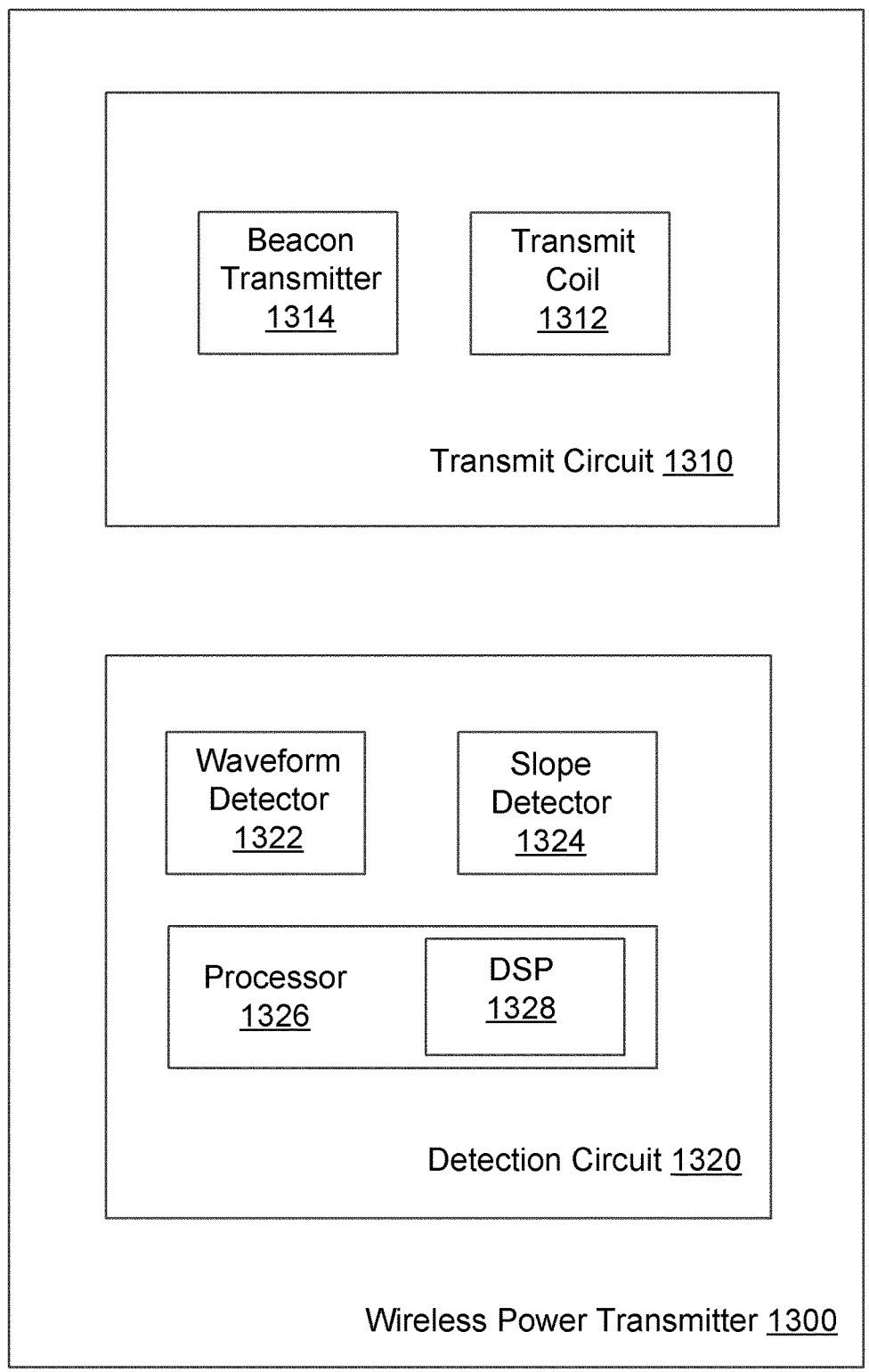
FIG. 13 is a functional block diagram of a device for detecting placement of a wireless power receiver in a charging region of a wireless power transmitter.

FIG. 13 is a functional block diagram of a device 1300 for detecting placement of a wireless power receiver in a charging region of a wireless power transmitter, in accordance with an exemplary embodiment of the disclosure. In one example, the device 1300 may include a transmit circuit 1310 comprising a transmit coil 1312 and configured to wirelessly transmit power to a receive coil of the receiver. The transmit circuit 1310 may include one or more components of the transmitter 404 of FIG. 4 and/or the transmit circuitry 600 of FIG. 6, the details of which are provided in further detail above.

In still further related aspects, the transmit circuit 1310 may include a low power beacon transmitter 1314 for detecting changes in the output impedance caused by placement of an object in a charging region of the transmit circuit 1310, while reducing standby power. The beacon transmitter 1314 may be configured to periodically apply a short beacon to a resonator of the transmit circuit 1310 to detect changes in impedance. With the short beacon, the device 1300 shall be capable of sensing the reactance and/or resistance change of the detected output impedance. The low power beacon transmitter 1314 may be further configured to initiate a higher power state upon detecting a load variation with the short beacon. For example, in response to detecting the load variation, the transmitter 1314 may be configured to apply a "long" beacon that may be longer or have higher power than the short beacon. The "long" beacon may provide sufficient power to the receiver to allow the receiver to have enough power to establish communication with transmitter to allow the transmitter 1314 to initiate higher power states. In related aspects, the beacon transmitter 1314 may be part of a detection circuit 1320 (described below) rather than the transmit circuit 1310. Also, the beacon transmitter 1314 may be a separate low power transmitter, or alternatively may be the primary power transmitter operated at a lower power.

The device 1300 may also include a detection circuit 1320 configured to detect a change in impedance presented to the transmitter, the change resulting from a field that is applied to the charging region or changed between the transmit and receive coils, in response to the receiver being placed in the charging region. For example, the detection circuit 1320 may correspond to or include the load sensing circuit 416 or the like of the transmitter 404 of FIG. 4, the details of which are provided in further detail above. In related aspects, the detection circuit 1320 may include a waveform detector 1322 for recognizing a characteristic waveform (e.g., including a transient spike in the transmitter current to the receiver) associated with a charging of a capacitor (e.g., filter capacitor) of the receiver during initial application of the field. The waveform may relate to or be based on the output impedance, the transmitter current, and/or the transmitter voltage. More generally, the detection circuit 1320 may be configured to detect an impedance change pattern or a type of impedance response (e.g., either via impedance or current response measurements) within a given time interval or period. The time interval/period for detecting a specific type of impedance change/waveform may occur during the short beacon.

In further related aspects, the detection circuit 1320 may include a slope detector circuit 1324 for detecting a slope of the measured output impedance (e.g., the trace in FIG. 9B) or the like. In yet further related aspects, the detection circuit 1320 may include a dedicated processor 1326 that may optionally have digital signal processing 1328 programmed into it to sample the waveform(s) and perform any processing/filtering to determine signal parameters in the sampled waveform(s). In still further related aspects, the above processing tasks may share the resources of an existing processor. In further related aspects, the beacon transmitter 1314 may be part of the detection circuit 1320 rather than the transmit circuit 1310.

Figure 14:
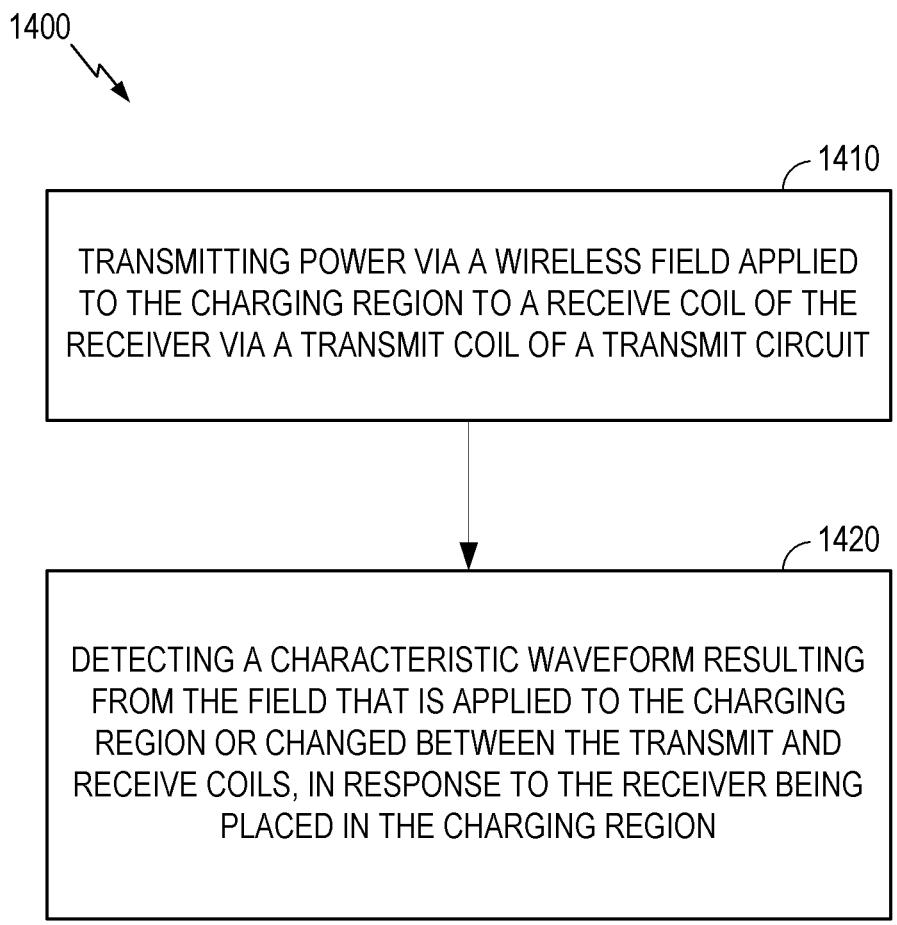
FIG. 14 is a flowchart of an example method for detecting placement of a wireless power receiver in a charging region of a wireless power transmitter.

FIG. 14 provides a flowchart of an exemplary method 1400 for wireless charging, and more particularly for detecting placement of a wireless power receiver in a charging region of a wireless power transmitter, in accordance with one or more aspects of the present disclosure. Although the method 1400 is described herein with reference to a particular order, in various implementations, the step(s) or feature(s) herein may be performed in a different order, or may be omitted, or may include additional step(s)/features(s). For example, the method 1400 may be operable by a wireless power transmitter (e.g., the device 1300 of FIG. 13) or component(s) thereof.

The method 1400 may involve, at 1410, transmitting power via a wireless field applied to the charging region to a receive coil of the receiver via a transmit coil of a transmit circuit. In one implementation, block 1410 may be performed by the transmit circuit 1310 of FIG. 13 or component(s) thereof. The method 1400 may involve, at 1420, detecting a characteristic waveform resulting from the field that is applied to the charging region or changed between the transmit and receive coils, in response to the receiver being placed in the charging region. In one implementation, block 1420 may be performed by the detection circuit 1320 of FIG. 13 or component(s) thereof. It is noted that the characteristic waveform may be associated with a charging of a capacitor of the receiver during initial application of the field, and may be based at least in part on a change in impedance presented to the transmit circuit of the transmitter in response to the receiver being placed in the charging region.

Figure 15:
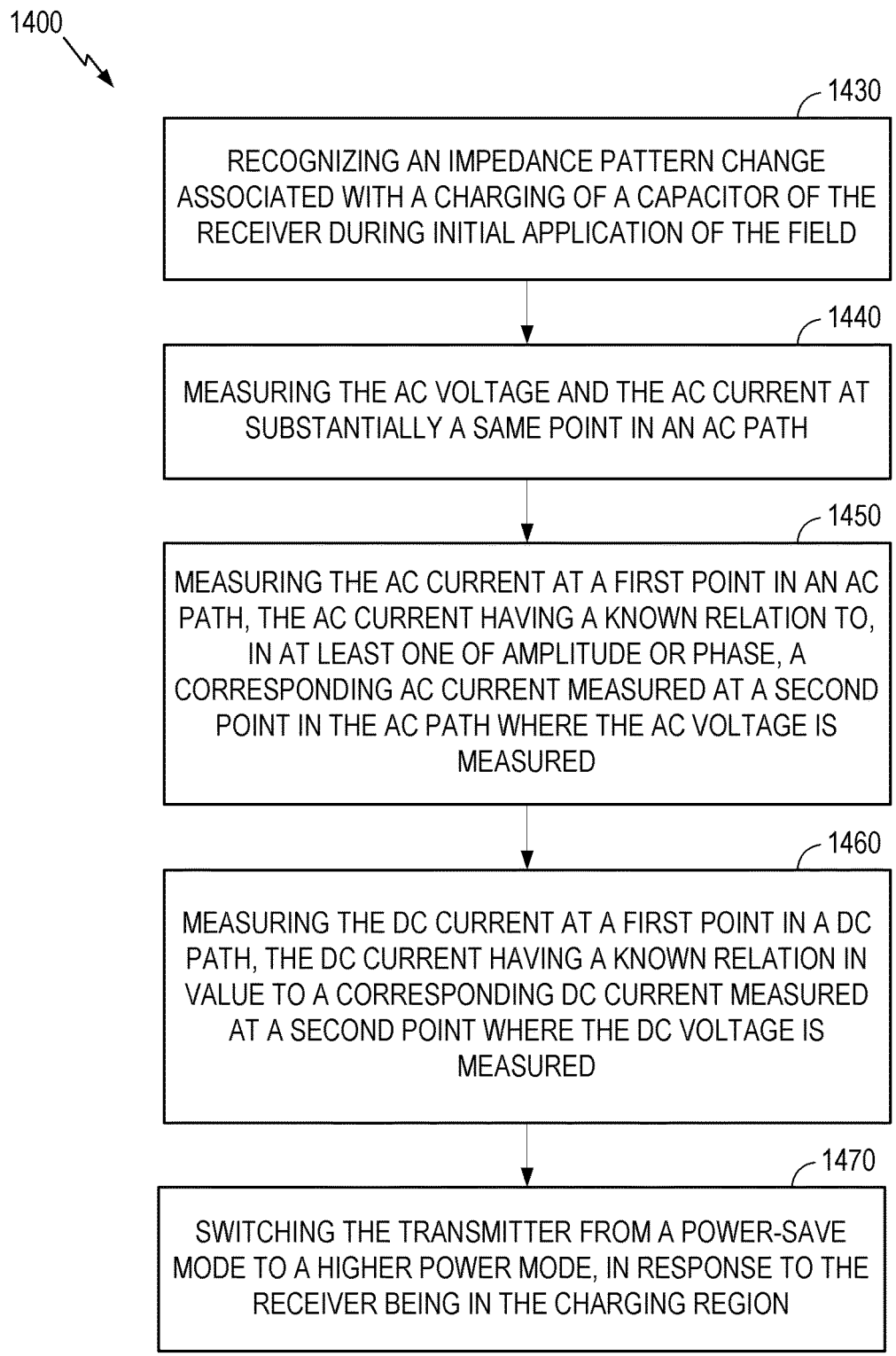
FIG. 15 shows further aspects of the example method of FIG. 14

With reference to FIG. 15, there are shown further operations or aspects of method 1400 that are optional are not required to perform the method 1400. If the method 1400 includes at least one block of FIG. 15, then the method 1400 may terminate after the at least one block, without necessarily having to include any subsequent downstream block(s) that may be illustrated. In related aspects, block 1420 may involve, at 1430, recognizing an impedance pattern change associated with a charging of a capacitor of the receiver during initial application of the field.

In further related aspects, the characteristic waveform may comprise a transient spike in resistance as calculated based on a transmitter voltage and a transmitter current, and the transmitter voltage may comprise an AC voltage and the transmitter current comprises an AC current. For example, block 1420 may involve, at 1440, measuring the AC voltage and the AC current at substantially a same point in an AC path. In another example, block 1420 may involve, at 1450, measuring the AC current at a first point in an AC path, the AC current having a known relation to, in at least one of amplitude or phase, a corresponding AC current measured at a second point in the AC path where the AC voltage is measured.

In yet further related aspects, the characteristic waveform may comprise a transient spike in resistance as calculated based on a transmitter voltage and a transmitter current, and the transmitter voltage may comprise a DC voltage and the transmitter current comprises a DC current. For example, block 1420 may involve, at 1460, measuring the DC current at a first point in a DC path, the DC current having a known relation in value to a corresponding DC current measured at a second point where the DC voltage is measured.

In still further related aspects, the method 1400 may further involve, at 1470, switching the transmitter from a power-save mode to a higher power mode, in response to the receiver being in the charging region.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations. In one aspect, means for transmitting power via a wireless field applied to the charging region to a receive coil of the receiver may comprise, for example, a transmit coil, a beacon transmitter, a power amplifier, and/or other component(s) of a transmit circuit.

In another aspect, means for detecting a characteristic waveform, in response to the receiver being placed in the charging region, may comprise, for example: a load sensing circuit; a waveform detector for recognizing a characteristic waveform associated with a charging of a capacitor of the receiver during initial application of the field; a slope detector for detecting a slope of a measured output impedance; a dedicated processor/controller; and/or other component(s) of a detection circuit.

In yet another aspect, means for detecting the characteristic waveform or recognizing an impedance change pattern associated with a charging of a capacitor of the receiver during initial application of the field may comprise, for example, a waveform detector for recognizing a characteristic waveform or pattern (e.g., including a transient spike in the transmitter current to the receiver) associated with a charging of a capacitor of the receiver during initial application of the field.

In still another aspect, means for measuring the AC voltage and the AC current at substantially a same point in an AC path may comprise, for example, a load sensing circuit, a waveform detector, a slope detector, a processor/controller, and/or other component(s) of a detection circuit.

In another aspect, means for measuring the AC current at a first point in an AC path may comprise, for example, a load sensing circuit, a waveform detector, a slope detector, a processor/controller, and/or other component(s) of a detection circuit.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A device for detecting placement of a wireless power receiver having a receiver capacitor in a charging region of a wireless power transmitter, comprising:
   a transmit circuit comprising a transmit coil and configured to wirelessly transmit power via a wireless field applied to the charging region to a receive coil of the receiver during a first period and a second period; and
   a detection circuit configured to i) detect a plurality of waveforms, of the transmit circuit, comprising a first waveform caused by a non-receiver object placed in the charging region and a second waveform that is a characteristic waveform caused by at least a charging pattern of the receiver capacitor in response to the receiver being placed in the charging region, ii) determine that the second waveform is the characteristic waveform of the receiver capacitor based on observing the charging pattern of the second waveform, and iii) determine whether the non-receiver object or the receiver is placed within the charging region based on detecting the first waveform or the second waveform.

2. The device of claim 1, wherein the characteristic waveform is based at least in part on a change in impedance presented to the transmit circuit of the transmitter in response to the receiver being placed in the charging region.

3. The device of claim 1, wherein the charging pattern is due to an impedance change pattern caused by a charging of the receiver capacitor of the receiver during the first period of the field.

4. The device of claim 1, wherein the characteristic waveform represents a transmitter current.

5. The device of claim 4, wherein the transmitter current comprises a direct current (DC) into a power amplifier (PA) of the transmitter.

6. The device of claim 1, wherein the characteristic waveform represents a transmitter voltage.

7. The device of claim 6, wherein the transmitter voltage comprises a DC voltage supplied to a power amplifier (PA) of the transmitter.

8. The device of claim 1, wherein the characteristic waveform represents a resistance as calculated based on a transmitter voltage and a transmitter current.

9. The device of claim 8, wherein the transmitter voltage comprises an alternating current (AC) and the transmitter current comprises an AC.

10. The device of claim 9, wherein the AC voltage and the AC are measured at substantially a same point in an AC path.

11. The device of claim 9, wherein the AC is measured at a first point in the AC path, the AC having a known relation to, in at least one of amplitude or phase, a corresponding AC measured at a second point in the AC path where the AC voltage is measured.

12. The device of claim 8, wherein the transmitter voltage comprises a DC voltage and the transmitter current comprises a DC.

13. The device of claim 12, wherein the DC voltage and the DC are measured at substantially a same point in a DC path.

14. The device of claim 12, wherein the DC is measured at a first point in a DC path, the DC having a known relation in value to a corresponding DC measured at a second point where the DC voltage is measured.

15. The device of claim 1, wherein the detection circuit is further configured to switch the transmitter from a power-save mode to a higher power mode, in response to the receiver being in the charging region.

16. The device of claim 1, wherein the detection circuit is further configured to detect a change in impedance presented to the transmitter, in response to the receiver being placed in the charging region, the receiver comprising receiver circuitry with a rectifier and the receiver capacitor in connected states, the receiver capacitor configured to charge during the first period of the field.

17. A method for detecting placement of a wireless power receiver having a receiver capacitor in a charging region of a wireless power transmitter, comprising:
   transmitting power via a wireless field applied to the charging region to a receive coil of the receiver via a transmit coil of a transmit circuit during a first period and a second period;
   detecting a plurality of waveforms, of the transmit circuit, comprising a first waveform caused by a non-receiver object placed in the charging region and a second waveform that is a characteristic waveform caused by at least a charging pattern of the receiver capacitor in response to the receiver being placed in the charging region;
   determining that the second waveform is the characteristic waveform of the receiver capacitor based on observing the charging pattern of the second waveform; and
   determining whether the non-receiver object or the receiver is placed within the charging region based on detecting the first waveform or the second waveform.

18. The method of claim 17, wherein detecting the characteristic waveform comprises recognizing an impedance change pattern caused by a charging of the receiver capacitor of the receiver during initial application of the field.

19. The method of claim 17, wherein:
   the characteristic waveform represents a resistance as calculated based on a transmitter voltage and a transmitter current.

20. The method of claim 19, wherein the transmitter voltage comprises an AC voltage and the transmitter current comprises an alternating current (AC), and wherein detecting the characteristic waveform comprises measuring the AC voltage and the AC at substantially a same point in an AC path.

21. The method of claim 19, wherein detecting the characteristic waveform comprises measuring the AC at a first point in an AC path, the AC having a known relation to, in at least one of amplitude or phase, a corresponding AC measured at a second point in the AC path where the AC voltage is measured.

22. The method of claim 19, wherein the transmitter voltage comprises a DC voltage and the transmitter current comprises a DC, and detecting the characteristic waveform comprises measuring the DC at a first point in a DC path, the DC having a known relation in value to a corresponding DC measured at a second point where the DC voltage is measured.

23. The method of claim 17, further comprising switching the transmitter from a power-save mode to a higher power mode, in response to the receiver being in the charging region.

24. An apparatus for detecting placement of a wireless power receiver having a receiver capacitor in a charging region, comprising:
   means for transmitting power via a wireless field applied to the charging region to a receive coil of the receiver during a first period and a second period;
   means for detecting a plurality of waveforms, of the means for transmitting power, comprising a first waveform caused by a non-receiver object placed in the charging region and a second waveform that is a characteristic waveform caused by at least a charging pattern of the receiver capacitor in response to the receiver being placed in the charging region;
   means for determining that the second waveform is the characteristic waveform of the receiver capacitor based on observing the charging pattern of the second waveform; and
   means for determining whether the non-receiver object or the receiver is placed within the charging region based on detecting the first waveform or the second waveform.

25. The apparatus of claim 24, wherein the means for detecting the characteristic waveform comprises means for recognizing an impedance change pattern caused by a charging of the receiver capacitor of the receiver during initial application of the field.

26. The apparatus of claim 24, wherein:
   the characteristic waveform represents a resistance as calculated based on a transmitter voltage and a transmitter current; and
   the transmitter voltage comprises an AC voltage and the transmitter current comprises an AC.

27. The apparatus of claim 26, wherein the means for detecting the characteristic waveform comprises means for measuring the AC voltage and the AC at substantially a same point in an AC path.

28. The apparatus of claim 26, wherein the means for detecting the characteristic waveform comprises means for measuring the AC at a first point in an AC path, the AC having a known relation to, in at least one of amplitude or phase, a corresponding AC measured at a second point in the AC path where the AC voltage is measured.

29. A non-transitory computer readable medium comprising code that, when executed, causes an apparatus to:
   transmit power via a wireless field applied to a charging region to a receive coil of a receiver via a transmit coil of a transmit circuit during a first period and a second period, the receiver having a receiver capacitor;
   detect a plurality of waveforms, of the transmit circuit, comprising a first waveform caused by a non-receiver object placed in the charging region and a second waveform that is a characteristic waveform caused by at least a charging pattern of the receiver capacitor in response to the receiver being placed in the charging region;
   determine that the second waveform is the characteristic waveform of the receiver capacitor based on observing the charging pattern of the second waveform; and determine whether the non-receiver object or the receiver is placed within the charging region based on detecting the first waveform or the second waveform.

30. The device of claim 1, wherein the detection circuit is further configured to determine that the first waveform caused by the non-receiver object placed in the charging region is not representative of the wireless power receiver.

31. The device of claim 1, wherein the characteristic waveform comprises a waveform having a first level during the first period that is greater than a substantially steady state level of the waveform during the second time period.

32. The method of claim 17, wherein the characteristic waveform comprises a waveform having a first level during the first period that is greater than a substantially steady state level of the waveform during the second time period.

33. The apparatus of claim 24, wherein the characteristic waveform comprises a waveform having a first level during the first period that is greater than a substantially steady state level of the waveform during the second time period.

34. The non-transitory computer readable medium of claim 29, wherein the characteristic waveform comprises a waveform having a first level during the first period that is greater than a substantially steady state level of the waveform during the second time period.

* * * * *